United States Patent [19]

Janum

[11] Patent Number: 4,945,302
[45] Date of Patent: Jul. 31, 1990

[54] PROCESS AND A CIRCUIT BOARD FOR PERFORMING TESTS DURING BURN-IN OF INTEGRATED SEMI-CONDUCTOR CIRCUITS

[75] Inventor: Viggo K. Janum, Allerod, Denmark

[73] Assignee: Scantest Systems A/S, Varlose, Denmark

[21] Appl. No.: 184,505

[22] Filed: Apr. 21, 1988

[30] Foreign Application Priority Data

Apr. 24, 1987 [DK] Denmark .............................. 2080/87

[51] Int. Cl.[5] ........................................... G01R 31/10
[52] U.S. Cl. ................................ 324/73.1; 324/158 F
[58] Field of Search ........... 324/73 R, 73 PC, 73 AT, 324/158 F; 219/385, 201

[56]  References Cited

U.S. PATENT DOCUMENTS 3,609,547  9/1971  Slusser .
3,842,346 10/1974  Bobbit .
4,374,317  2/1983  Bradshaw .
4,379,259  4/1983  Varadi et al. .
4,468,616  8/1984  Yoshizaki .
4,542,341  9/1985  Santomango et al. .
4,749,947  6/1988  Gheewala ..................... 324/73 AT

FOREIGN PATENT DOCUMENTS 0047141  6/1984  European Pat. Off. .

OTHER PUBLICATIONS

Bruder et al., Carrier Assembly for Component Aging 8/71 IBM Technical Disclosure Bulletin vol. 14 No. 3 p. 737.

Primary Examiner—Reinhard J. Eisenzopf
Assistant Examiner—Edward Urban
Attorney, Agent, or Firm—Finnegan, Henderson, Farabow, Garrett and Dunner

[57]  ABSTRACT

A process for the burn-in of either or both analog and digital integrated circuits where the various functions in the individual circuits are tested continuously and individually, while the circuits are cyclically caused to work at extreme temperatures, and the test is stopped when a predetermined error rate has been reached. To perform the process, a circuit board comprises, in addition to the circuits tested at intermittent elevated temperatures, also auxiliary circuits for data collection and data compaction, said circuits being present at a constant normal working temperature during the burn-in sequence.

14 Claims, 2 Drawing Sheets

PROCESS AND A CIRCUIT BOARD FOR PERFORMING TESTS DURING BURN-IN OF INTEGRATED SEMI-CONDUCTOR CIRCUITS

The present invention concerns a process and a circuit board for performing tests during burn-in of integrated semi-conductor circuits.

In the production of integrated semi-conductor circuits, the semi-conductor circuits are usually subjected to a general functional test before leaving the factory so as to ensure, to some extent, that the customer will receive a useful product. However, it is generally known that the later that errors are detected and remedied in the manufacturing process of a product, the more expensive it is to remedy these errors. Accordingly, great interest attaches to the performance of a total functional test; and a so-called burn-in of integrated circuits. Burn-in of integrated circuits means testing under conditions which cause accelerated ageing of the circuits so that it is possible to find errors in the circuits which would otherwise only occur after some use. This makes it possible to reduce the error rate in the lifetime of the devices.

BACKGROUND OF THE INVENTION

In the first industrial processes for burn-in of integrated circuits, these were arranged at elevated temperatures and were provided with the necessary supply voltages, and the components were tested separately after a specified period of time under these circumstances in a testing device designed for this purpose; after sorting of the faulty circuits, the remaining circuits were again subjected to operation at elevated temperatures, and these components were again tested after a specified period of time, with repetition of this process until the desired low error rate was reached in the testing. This type of testing, however, is vitiated by considerable drawbacks, because the circuits are to be handled repeatedly, and even though the process can take place automatically, a not insignificant part of the circuits has to be rejected because of purely mechanical damage.

The U.S. Pat. No. 4,379,259 discloses a process for functional testing and burn-in of storage circuits, which is vitiated by the drawback that the circuits form part of functional units and can therefore only be tested in large or small groups, and an error in one of the circuits in a group makes it impossible to proceed with the testing for the other circuits in the group.

The U.S. Pat. No. 4,507,544 and 4,374,317 disclose devices for testing integrated circuits at elevated temperatures, but the devices described there are vitiated by considerable drawbacks since it is only possible to transfer a limited number of signals between the circuits under testing and the surroundings.

SUMMARY OF THE INVENTION

The object of the present invention is to provide a process and an apparatus permitting a full functional test during burn-in of a large number of complex integrated circuits, without it being necessary to handle the circuits more than twice, i.e. insertion into and removal from the testing apparatus.

Another object of the present invention is to provide a process for testing during burn-in, which enables control of the testing time in such a manner that the circuits are not maintained in the testing situation longer than necessary to determine the desired low error rate. This makes it possible to reduce the flow time during testing, which is essential because of the testing of very complex components and large amounts of components.

The stated objects are obtained by the process that includes testing each circuit independently of the other circuits, recording the number of errors in the separate circuits, and repeating the operating and testing cycle until the number of new faulty circuits is less than a pre-determined maximum value for a pre-determined period of time in that each circuit is tested completely independently of the other circuits, and in that the number of errors in the individual circuits and the sum of the faulty circuits are recorded, the testing being terminated when for a specified period of time the number of errors recorded does not exceed a specified maximum value.

Since the individual circuits are tested completely independently of the other circuits, it is possible, by simultaneous testing of a plurality of circuits of different types, and discontinuing the testing of a circuit board upon attainment of a desired error rate for the circuits in question to test various circuits, and thus it is possible also to test digital and analog circuits at the same time.

A circuit board which extends through the hot and cold regions of a climate chamber, the board portion disposed in the hot region carrying the circuits to be tested, and the board portion disposed in the cold region carrying the circuits serving to test the circuits in the hot region, includes at least two separate connections between each circuit in the hot region and the circuits in the cold region, the circuits in the cold region being adapted to analyze and compact the measuring data received from the hot region; and to transfer the data thus pre-processed to a data processing unit. Such a circuit board is advantageous in the performance of the process of the invention. When circuits for data collection and data compaction are placed on the circuit board carrying the circuits to be tested, it is possible to establish the number of connections necessary for individual monitoring of the circuits.

Thus, the data collection circuits which include the data analysis and composition circuits, may be arranged to process both analog and digital signals.

When the conducting paths of the circuit board are arranged as transmission paths with predetermined impedance the signal transfer to and from the circuits to be tested is improved significantly, thus ensuring that errors are not recorded erroneously because of poor signal transfer.

When the circuit board is arranged it is possible to monitor the signals fed to the circuits during testings, and this makes it additionally certain that testings take place under optimum conditions.

BRIEF DESCRIPTION OF THE DRAWINGS

The present invention will be described more fully below with reference to the drawing, in which.

The curve shown applies to components as well as to assembled apparatus, but it is possible to reduce the number of errors in the finished apparatus by testing and performing so-called burn-in of the components incorporated in the apparatus. This is particularly attractive when the components to be tested have a high degree of complexity, i.e. microprocessors and storage circuits. What is of interest in this burn-in is to bring the component population through region A and into region B, thus ensuring that a constantly low error rate will occur for a long time ahead.

Figure 1:
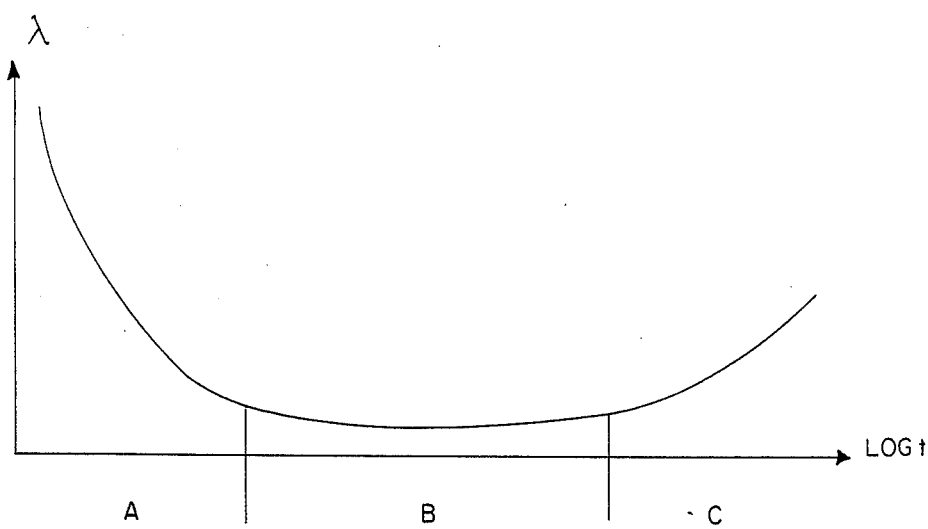
FIG. 1 shows the known error rate "hammock" curve, FIG. 2 schematically shows the known testing procedure, FIG. 3 schematically shows the testing process of the present invention.
Figure 2:
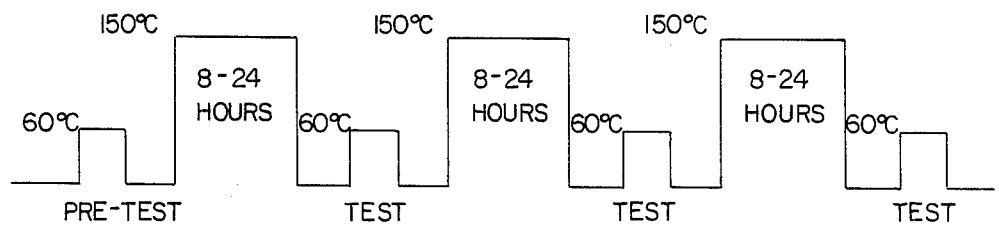

FIG. 2 schematically shows the testing sequence according to the previously known burn-in methods. This testing sequence comprises testing of the total amount of components to be tested, and those found to be good in this examination are then heated to 150° to 200° C. for a period of time of 8 to 24 hours. Then the temperature is lowered, and the components are examined at more normal temperatures. This cycle is repeated until a component error rate corresponding to region B in FIG. 1 is reached empirically. During the time when the components are heated to 150° to 200° C., they are only subjected to supply voltage and quite a few excitation pulses.

This testing makes it possible to find almost all faulty components if sufficient time is allocated to the examination. However, it is difficult to decide precisely in this testing method when the desired minimum error rate is reached, which entails that, to be on the safe side, the components are often subjected to high temperatures for a longer time than absolutely necessary, which, of course, results in an unnecessary component ageing.

Figure 3:
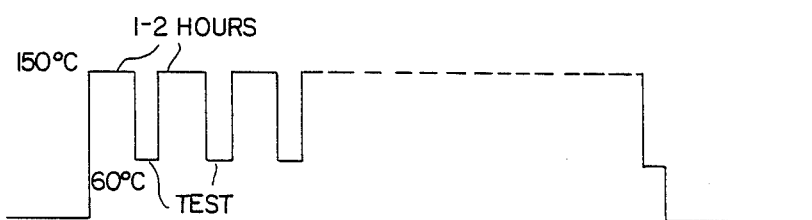

The process of the present invention, which is shown in FIG. 3, is a contrast to this. Here, the components are introduced, without a pre-test, into the testing apparatus and are heated to 150° to 200° C. for one or two hours, following which the temperature is lowered to about 60° C., and each individual component is tested. It is recorded in this testing which components fail, and the temperature is increased again to 150° to 200° C. for a specified short period of time, and then the temperature is lowered and the examination is repeated. This cycle is repeated until the desired minimum error rate is recorded.

The advantage of this process is that the components are only held at the elevated temperature for a short period of time, following which they are tested; this provides for great precision in the determination of the point on the error rate curve where the testing is to be stopped. Another advantage of this process is the possibility of recording any shiftings in the error rate curve which may indicate general errors in the manufacture of the integrated circuits. Therefore, this testing process results in a considerably improved control of the production quality and moreover entails that no more time is spent on the testing than is strictly necessary.

Figure 4:
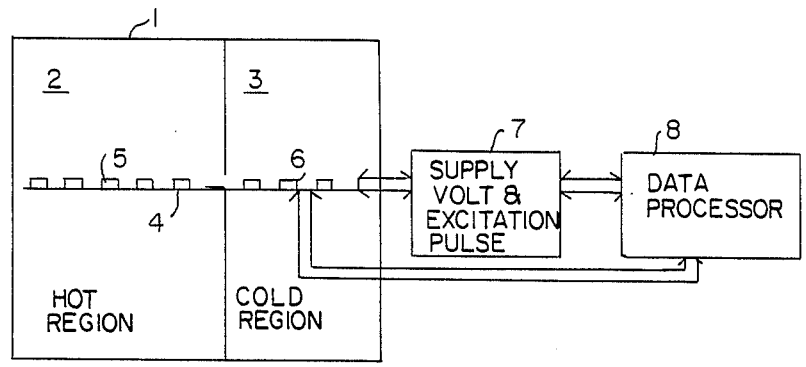
FIG. 4 is a simplified block diagram of an apparatus and a circuit board for performing the process of the invention, and FIG. 5 schematically shows a circuit board of the invention, The so-called "hammock" curve shown in FIG. 1 is known from the usual error rate analyses of large component populations. As can be seen, the curve can be divided into three main regions, where region A describes the error rate sequence dring the first part of the life-time of the component, region B, which is an approximately horizontal line, describes the error rate in what is commonly called the lifetime, and region C describes the error rate after the lifetime of the components.

However, the testing process of the present invention requires the testing apparatus to be constructed in another manner than before. FIG. 4 shows in outline how an apparatus for performing the process can be built. FIG. 4 shows that the apparatus is built around a climate chamber 1 comprising a hot region 2 and a cold region 3. The climate chamber 1 accommodates a circuit board 4 whose region 5, in the hot region, carries the circuits to be tested, and whose region 6, in the cold region 3, carries circuits cooperating in the testing of the circuits in the hot region. The part 6 of the circit board 4 communicates with a supply voltage and excitation pulse circuit 7 which generates the supply and excitation voltages necessary for the testing of the circuits. The circuits on the region 6 of the circuit board and the circuits 7 are controlled by a data processing unit 8.

The circuit board 4 is constructed in such a manner that there is a very large number of circuit connections between the regions 5 and 6. The circuits on the region 6 of the circuit board are adapted to perform data collection and data compaction on data which are collected from the circuits mounted on the region 5. Owing to the large number of conduction connections between the regions 5 and 6 it is possible to test each individual circuit on the region 5 because at least two connections are present between the region 6 and each of the circuits in the region 5.

The very large data amounts resulting from the testing of each individual circuit in the region 5 are collected and pre-processed by the circits in the region 6, and are caused to assume a form enabling transfer of data in a rational manner between these circuits and the data processing unit 8.

The data processing unit 8 can control the data collection and data compaction circuits 6 to perform various types of data processing. Likewise, the data processing unit 8 controls the supply and excitation circuits 7 to produce the signals necessary for the testing. The circuits 6 may be adapted to monitor the signals arriving from the unit 7, so that it is possible to check that the circuits in the region 5 are fed with correct signals.

Since it is very important for the test results that the circuits are fed with good quality signals, and that the signal returned to the data collection and data compaction circuits are likewise of a good quality, the conducting paths of the circuit are arranged as transmission lines with a pre-determined impedance; this enables control of the signal quality on the circuit board to provide correct excitation pulses and to provide undistorted measuring signals.

The circuits in the region 6 may be adapted to collect digital or analog data or a mixture of these, and when the circuits in the region 6 are suitably arranged, it is possible to adapt the testing equipment for testing of any type of integrated circuits.

Figure 5:
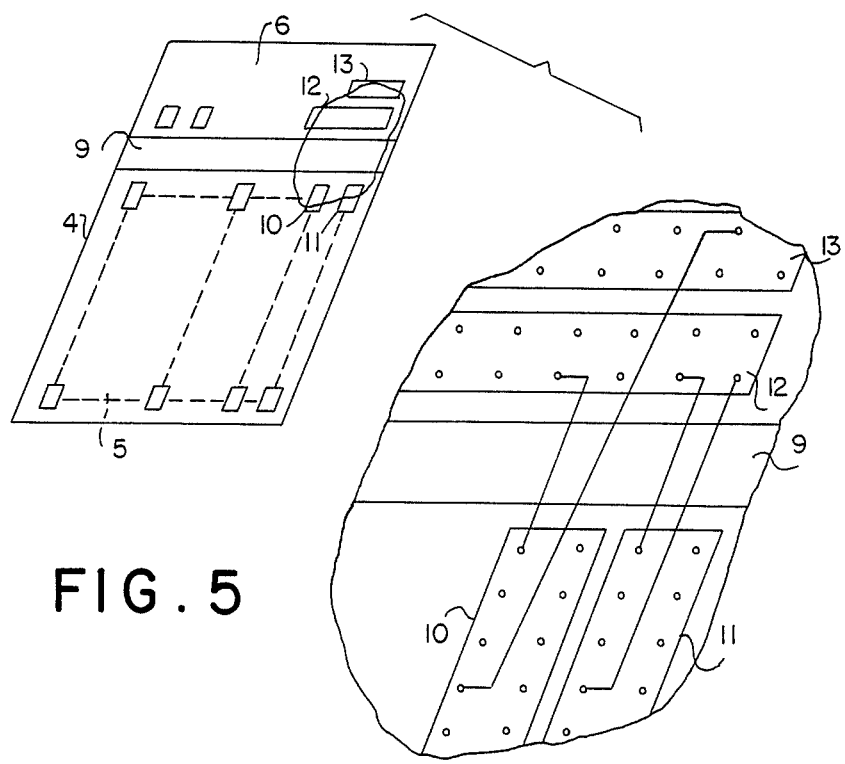

FIG. 5 schematically shows a circuit board 4, whose hot region 5 and cold region 6 are separated by a region 9 through which the conducting connections between the regions 5 and 6 pass. The reference numerals 10 and 11 indicate circuits which are being tested, and 12 and 13 indicate circuits cooperating in the testing. As mentioned, at least two connections are provided between a circuit in the hot region and one or more circuits in the cold region.

As many circuits are tested simultaneously in the hot region, the number of connections between the regions 5 and 6 is very large; and it is therefore necessary that the circuit board is manufactured with many layers.

I claim:

1. A process for dynamic testing and burn-in of a plurality of integrated circuits of a circuit board, comprising the steps of:
   heating each circuit board to an elevated temperature for a predetermined time period corresponding to a pre-determined operating life of the integrated circuits;
   cooling each circuit board to an operating temperature substantially lowr than the elevated temperature;
   testing functionally at the operating temperature each individual integrated circuit of the circuit board independently of other integrated circuits of the board; and
   repeating the heating step subsequent to each testing step until the error rate of the individual integrated circuits reaches a pre-determined level during a testing step.

2. The process of claim 1, wherein the elevated temperature is in the range of from 150 to 200 degrees centigrade.

3. The process of claim 2, wherein the pre-determined time period is in the range of from approximately one to two hours.

4. The process of claim 3, wherein the operating temperature is approximately 60 degrees centigrade.

5. A process for dynamic testing and burn-in of a plurality of integrated circuits of a circuit board, comprising:
   providing a climate chamber having a hot region and a separate cold region;
   providing a circuit board having a plurality of integrated circuits to be tested disposed in a hot portion of the integrated circuits to be tested disposed in a hot portion of the circuit board, and having circuits for testing each of the integrated circuits individually and independent of other integrated circuits of the board disposed in a cold portion of the circuit board separate from the hot portion, and having connecting means connecting the circuits to be tested and the testing circuits;
   positioning the circuit board relative the climate chamber to align the integrated circuits to be tested in the hot region of the climate chamber and the circuits for testing in the cold region of the climate chamber;
   heating the hot region of the climate chamber to heat the hot portion of the circuit board aligned in the hot region to an elevated temperature for a pre-determined time duration corresponding to a pre-determined operating life while maintaining the testing circuit portion of the board at a temperature substantially lower than the elevated temperature;
   cooling the hot region of the climate chamber for cooling the integrated circuits to be tested to a pre-determined operating temperature;
   testing functionally each individual integrated circuit of the board independently of the other integrated circuits at the operating temperature;
   repeating the heating step subsequent to each testing step until the error rate of the individual integrated circuits reaches a pre-determined level during a testing step; and
   removing the circuit board from the climate chamber subsequent to the testing cycle during which the pre-determined error rate is reached.

6. The process of claim 5, wherein the hot and cold regions of the climate chamber are separated by an intermediate region in registry with the connecting means at times the circuit board is positioned relative the climate chamber.

7. The process of claim 5, wherein the connecting means of the circuit board is a transmission line having a pre-determined impedance.

8. The process of claim 5, wherein the time duration is in the range of approximately one to two hours.

9. The process of claim 8, wherein the elevated temperature is in the range of approximately 150 to 200 degrees centigrade and the operating temperature is in the range of 60 degrees centigrade.

10. The process of claim 5, wherein the connecting means includes at least two connectors connecting the testing circuits to each individual integrated circuit to be tested.

11. A unitary circuit board for the dynamic testing annd burn-in of a plurality of integrated circuits contained thereon wherein the integrated circuits are subjected to extreme elevated temperatures in a hot region of a climate chamber and then tested at normal opening temperatures in a cold region of the climate chamber, said unitary circuit board comprising:
   a hot portion, having the integrated circuits to be tested, for registry with the hot region of the climate chamber;
   a cold portion, having circuits for testing the integrated circuits, for registry with the cold region of the climate chamber separate from the hot portion of the circuit board and;
   continuous conductive path means connecting the circuits to be tested to the testing circuits, said path means including at least two separate connections electrically connecting each individual circit in the hot portion ot the circuits in the cold portion;
   said circuits in the cold portion for analyzing and compacting measuring data received over the path means from the hot portion and for transferring data to a central processing unit.

12. The circuit board of claim 11, wherein the analyzing and compacting data are for processing both digital and analog signals.

13. The circuit board of claim 11, wherein the path means includes transmission lines having a pre-determined impedance.

14. The circuit board of claim 11, wherein the testing circuit transfers and monitors externally produced supply voltages and excitation pulses for the functional testing of each of the individual integrated circuits.

* * * * *

UNITED STATES PATENT AND TRADEMARK OFFICE
CERTIFICATE OF CORRECTION

PATENT NO. : 4,945,302

DATED : July 31, 1990

INVENTOR(S) : VIGGO K. JANUM

It is certified that error appears in the above-identified patent and that said Letters Patent is hereby corrected as shown below:

Claim 1, column 5, line 9, "lowr" should be --lower--.

Claim 11, column 6, line 27, "annd" should be --and--;

line 44, "ot" should be --to--.

Signed and Sealed this

Twenty-second Day of September, 1992

Attest:

DOUGLAS B. COMER

Attesting Officer

Acting Commissioner of Patents and Trademarks